US011822231B2

(12) United States Patent
Liu et al.

(10) Patent No.: US 11,822,231 B2
(45) Date of Patent: Nov. 21, 2023

(54) METHOD FOR REMOVING PARTICLES FROM PELLICLE AND PHOTOMASK

(71) Applicant: TAIWAN SEMICONDUCTOR MANUFACTURING COMPANY LTD., Hsinchu (TW)

(72) Inventors: Tzu Han Liu, Tainan (TW); Chih-Wei Wen, Tainan (TW); Chung-Hung Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 189 days.

(21) Appl. No.: 17/373,695

(22) Filed: Jul. 12, 2021

(65) Prior Publication Data
US 2022/0317562 A1   Oct. 6, 2022

Related U.S. Application Data

(60) Provisional application No. 63/167,871, filed on Mar. 30, 2021.

(51) Int. Cl.
*G03F 1/64* (2012.01)
*G03F 7/20* (2006.01)
*G03F 7/00* (2006.01)

(52) U.S. Cl.
CPC ............ *G03F 1/64* (2013.01); *G03F 7/70025* (2013.01); *G03F 7/70916* (2013.01); *G03F 7/70983* (2013.01)

(58) Field of Classification Search
CPC .......... G03F 1/62; G03F 1/64; G03F 7/70025; G03F 7/70983
USPC ........................................................... 430/5
See application file for complete search history.

(56) References Cited

U.S. PATENT DOCUMENTS

| 7,628,865 | B2 | 12/2009 | Singh |
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2006/0086371 | A1 | 4/2006 | Ohkubo et al. |

FOREIGN PATENT DOCUMENTS

| EP | 1850182 A2 | 10/2007 |
| TW | 200745782 A | 12/2007 |

OTHER PUBLICATIONS

Office Action, Cited Reference (US20060086371A1) and Search Report dated May 20, 2022 issued by the Taiwan Intellectual Property Office for the Taiwanese Counterpart Patent Application No. 110132912.
U.S. Pat. No. 7,628,865B2 corresponds to EP1850182A2.
U.S. Pat. No. 7,628,865B2 corresponds to TW200745782A.

*Primary Examiner* — Christopher G Young
(74) *Attorney, Agent, or Firm* — WPAT LAW; Anthony King

(57) ABSTRACT

A method for removing particles includes receiving a pellicle including a pellicle membrane, a pellicle frame and at least a particle disposed on the pellicle membrane, generating light beams to form an optical trap extending in a direction perpendicular to the pellicle membrane, and removing the particle from the pellicle membrane by the optical trap.

20 Claims, 21 Drawing Sheets

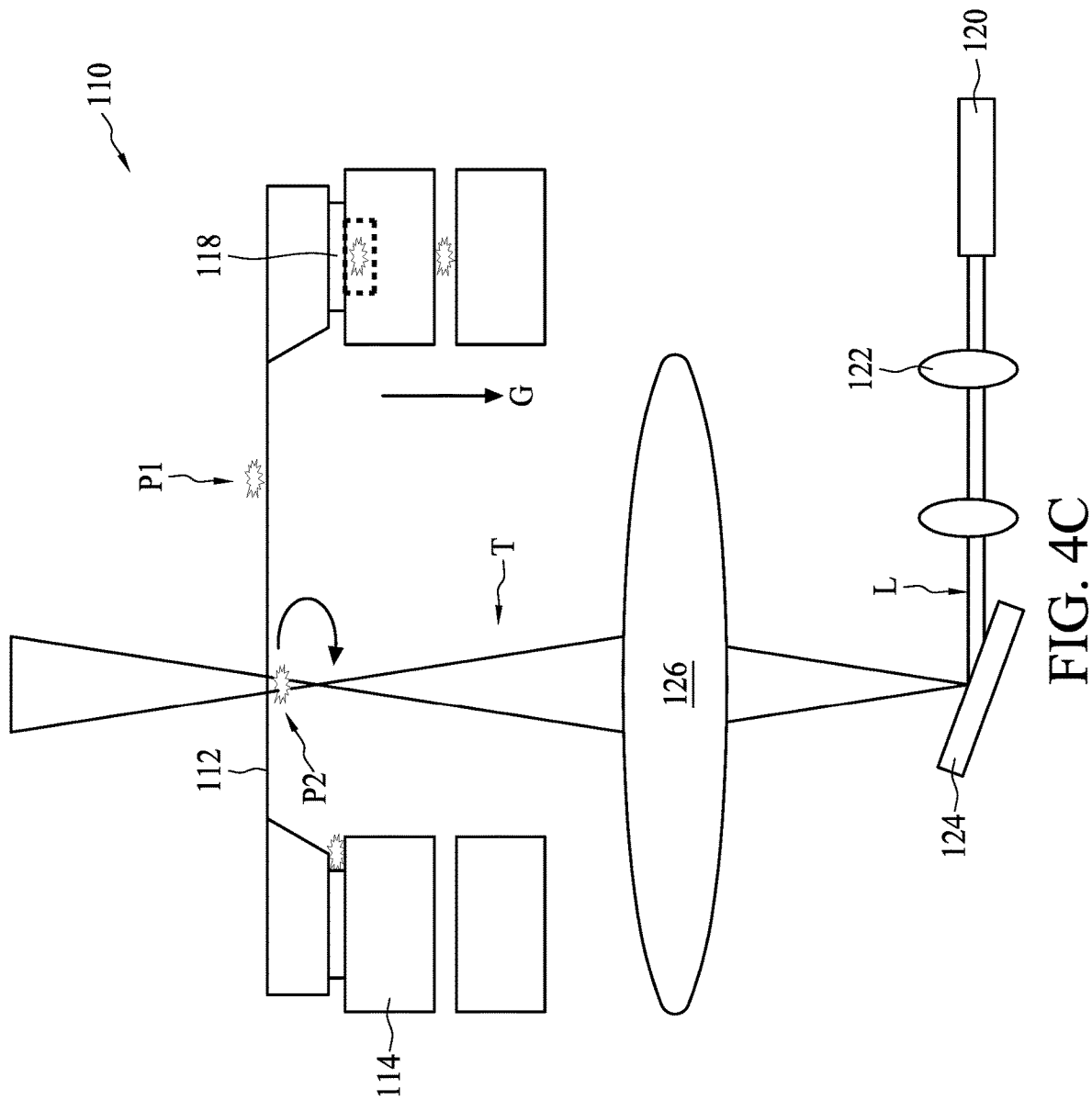

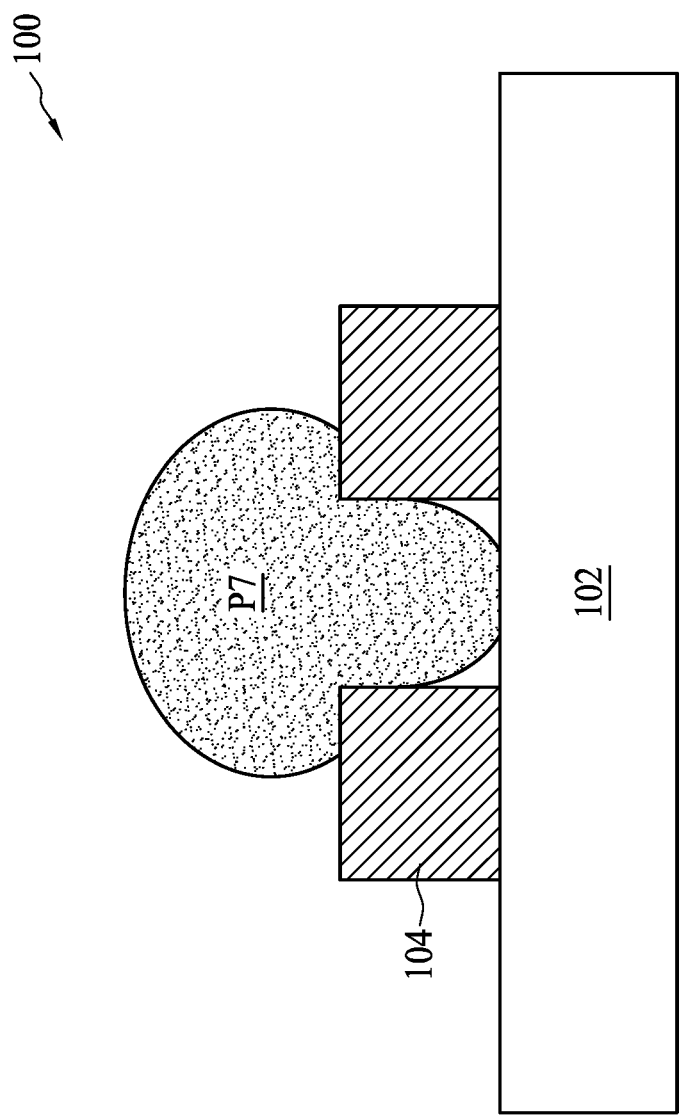

METHOD FOR REMOVING PARTICLES FROM PELLICLE AND PHOTOMASK

PRIORITY DATA

This patent claims the benefit of U.S. Provisional Patent Application Ser. No. 63/167,871 filed Mar. 30, 2021, the entire disclosure of which is hereby incorporated by reference.

BACKGROUND

The semiconductor industry has experienced rapid growth, due in part to ongoing improvements in the integration density of a variety of electronic components (e.g., transistors, diodes, resistors, capacitors, etc.). Improvements in integration density have mostly resulted from iterative reduction of minimum feature size, which allows more components to be integrated into a given area. Such scaling down introduced increases complexity to the semiconductor manufacturing process.

As one example, a photolithography process may use a photomask (also referred to as a reticle) to optically transfer patterns onto a substrate. The minimum feature size that may be patterned by way of such a lithography process is limited by the wavelength of the radiation projected by the radiation source. In view of this extreme ultraviolet (EUV) radiation sources and lithography processes have been introduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A to 4D are schematic drawings illustrating stages of the method for removing particles according to aspects of the present disclosure.

FIGS. 13A to 13D are schematic drawings illustrating stages of the method for removing particles according to aspects of the present disclosure.

DETAILED DESCRIPTION

Figure 1:
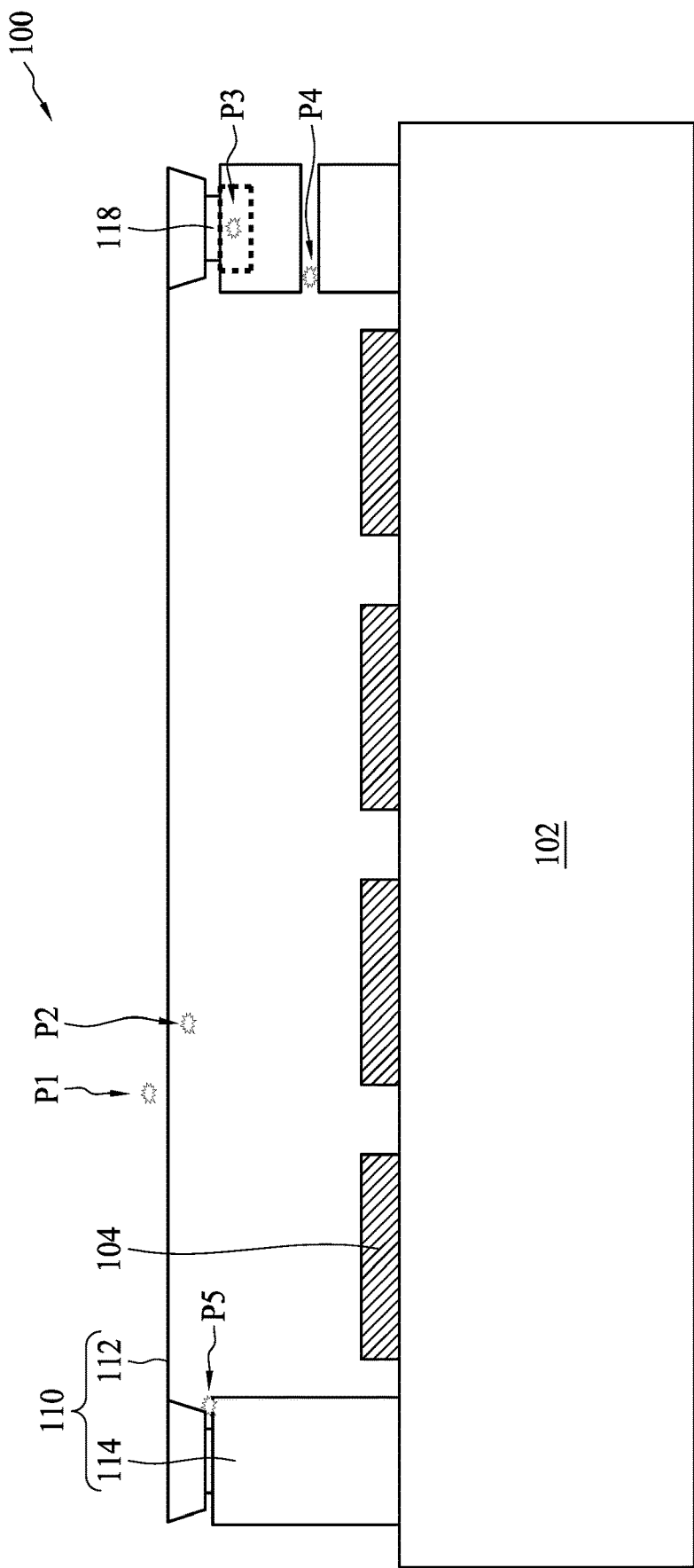
FIG. 1 is a cross-sectional view illustrating a photomask according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; rather, the scope of the disclosure shall be defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The term "mask," "photomask," and "reticle" may be used interchangeably to refer to a lithographic template, such as an EUV mask.

EUV systems, which utilize reflective rather than refractive optics, are very sensitive to contamination issues. In some comparative approaches, particle contamination introduced onto a reflective EUV mask can result in degradation of the lithographically transferred patterns. As such, it is necessary to provide a pellicle membrane over an EUV mask to serve as a protective cover which protects the EUV mask from damage and/or contaminant particles.

The pellicle membrane may be secured to a photomask substrate by a pellicle frame. In some comparative embodiments, the pellicle frame includes one or more ventilation holes or cuttings for ventilation. Further, the ventilation holes or the cuttings may equalize the pressure between a space inside the mask-pellicle system and the space outside of the mask-pellicle system. It is found that particles may accumulate on the pellicle membrane during forming of the pellicle membrane. The particles may also fall on the pellicle membrane during pellicle-frame assembling operation. Further, the particles may also accumulate on the cutting or the ventilation hole of the frame. The above-mentioned particles may migrate or drop onto the patterns formed on the photomask substrate from the pellicle membrane or from the cutting/ventilation hole during an exposure operation. The fallen particle issue may severely impinge on wafer yield.

The present disclosure therefore provides a method for removing particles from the pellicle and from the photomask. The method uses an optical trapping technology for quick particle removal. In some embodiments, a vertical light trap may be provided using the optical trapping technology to remove particles from the pellicle membrane. In some embodiments, a horizontal trap may be provided using the optical trapping technology to remove the particles from the pellicle frame cuttings and from the ventilation holes. In some embodiments, the photomask may be turned upside down, such that gravitational force may be used in addition to the method using the optical trapping technology to remove the particles from the photomask substrate. According to the method, the particles may be efficiently removed and thus the fallen particle issue may be mitigated. Further, used of the optical trapping technology causes little damage to the pellicle membrane, the pellicle frame and the photomask substrate.

Please refer to FIG. 1, wherein FIG. 1 is a cross-sectional view illustrating a photomask 100. In some embodiments, the photomask 100 may be an EUV photomask with a pellicle. The photomask 100 including the pellicle may be referred to as a pellicle type photomask. As shown in FIG. 1, the photomask 100 includes a photomask substrate 102 (also referred to as a blank). The photomask substrate 102 may be a low thermal expansion material (LTEM) substrate. In some embodiments, a backside coating layer (not shown) may be disposed over a backside of the photomask substrate 102. The backside coating layer may include a chromium nitride ($Cr_xN_y$) layer. In some embodiments, the photomask substrate 102 includes a multi-layered structure, though not shown. By way of example, the multi-layered structure may include molybdenum-silicon (Mo—Si) multi-layers. In some embodiments, a thickness of each Mo layer may be approximately 3 nanometers, and a thickness of each Si layer may be approximately 4 nanometers. Desired diffraction characteristics may influence the thickness and/or number of layers of the Mo—Si multi-layers. In some embodiments, the photomask substrate 102 may include a capping layer (not shown). The capping layer may include a ruthenium (Ru) layer, a Si layer and/or another suitable material layer. The capping layer helps protect the multi-layered structure during fabrication and use of the photomask 100. In some embodiments, an absorber pattern 104 is formed over the substrate 102. The absorber pattern 104 may include, for example, a tantalum nitride (TaN) layer, a tantalum boron nitride (TaBN) layer or a tantalum boron oxynitride (TaBON) layer. The absorber pattern 104 is configured to absorb EUV light (e.g., light with a wavelength of about 13.5 nanometers). In some embodiments, other materials such as, for example but not limited thereto, aluminum (Al), tungsten (W), Cr, Ta, and other suitable compositions may be used to form the absorber pattern 104.

It should be noted that while some examples of materials that may be used for each of the photomask substrate 102, the backside coating layer, the multi-layer structure, the capping layer and the absorber pattern 104 have been provided, it should be understood that other suitable materials as known in the art may be similarly used without departing from the scope of the present disclosure. Similarly, other mask configurations may also be provided.

Exemplary fabrication methods for the photomask 100 are briefly summarized below. These operations are exemplary and not intended to be limiting beyond what is specifically provided in the claims recited below. In some embodiments, the fabrication operations include two stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect-free surface). In some embodiments, a capping layer is formed over the multi-layered structure, followed by deposition of an absorber layer. The absorber layer is patterned to form the desired absorber pattern 104 on the photomask substrate 102. In some embodiments, an anti-reflective (ARC) layer may be deposited over the absorber layer prior to the patterning. The photomask 100 including the desired pattern may then be used to transfer circuit and/or device patterns onto a semiconductor wafer. In various embodiments, the patterns defined by the photomask 100 can be transferred onto multiple wafers through various lithography processes. In addition, a set of photomasks may be used to construct a complete integrated circuit (IC) device and/or circuit.

In various embodiments, the photomask 100 may be fabricated to include different structure types such as, for example, a binary intensity mask (BIM) or a phase-shifting mask (PSM). An exemplary BIM includes opaque absorbing regions and reflective regions, where the BIM includes a pattern (e.g., an IC pattern) to be transferred to the semiconductor substrate. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer structure. Additionally, in some embodiments, the photomask 100 may include a PSM which utilizes interference produced by phase differences of light passing therethrough. Examples of PSMs include an alternating PSM (AltPSM), an attenuated PSM (AttPSM), and a chromeless PSM (cPSM). For example, an AltPSM may include phase shifters (of opposing phases) disposed on either side of each patterned mask feature. In some examples, an AttPSM may include an absorber layer having a transmittance greater than zero (e.g., a Mo—Si layer having about a 6% intensity transmittance). In some cases, a cPSM may be described as a 100% transmission AltPSM, for example, because the cPSM is free of phase shifter material or chrome on the mask.

As described above, the photomask 100 includes a patterned image that may be used by a lithography system to transfer circuit and/or device patterns onto a semiconductor wafer. To achieve a pattern transfer from the photomask 100 having a sufficiently high fidelity, it is desired to reduce or avoid introduction of defects onto the photomask 100. For example, particles that unintentionally fall on the surface absorber pattern 104 or the substrate 102, if not removed, may result in degradation of lithographically transferred patterns. Particles may be introduced by any of a variety of fabrication methods, handling methods, and/or use of the photomask 100 in a lithography system such as the lithography system described herein.

In some embodiments, the photomask 100 may include a pellicle 110 attached over the photomask 100 to serve as a protective cover. The pellicle 110 can serve to protect the mask from damage and contaminant particles. The pellicle 110 may include a pellicle membrane 112 and a pellicle frame 114. In some embodiments, the pellicle membrane 112 may be attached to the pellicle frame 114 by a glue 118.

Figure 2:
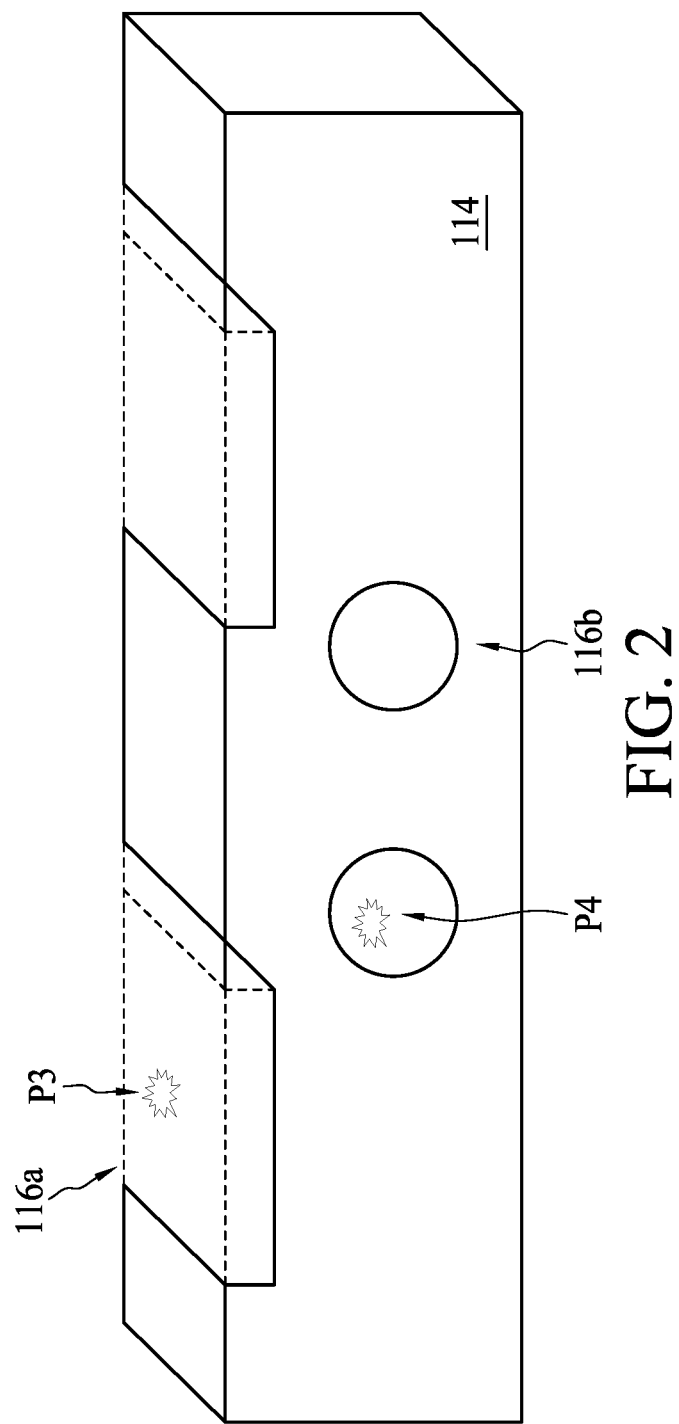
FIG. 2 is a cross-sectional view illustrating a portion of a photomask according to aspects of the present disclosure.

Referring to FIGS. 1 and 2, in some comparative approaches, particles may fall on the pellicle 110 during formation and assembly of the pellicle. For example, a particle P1 may fall on an externally-facing surface of the pellicle membrane 112, a particle P2 may fall on an internally-facing surface of the pellicle membrane 112, a particle P3 may fall on a frame cutting 116a of the frame 114, a particle P4 may fall on a ventilation hole 116b, and/or a particle P5 may fall on a junction between the pellicle membrane 112 and the pellicle frame 114. It should be noted that while the particles P1, P2, P3, P4, P5 are illustrated as having a circular shape, it will be understood that other particle shapes and sizes are possible, and are intended to fall within the scope of the present disclosure. As mentioned above, the above-mentioned particles P1, P2, P3, P4, P5 may migrate or drop onto the absorber pattern 104 and the photomask substrate 102 from the pellicle membrane 112 or from the cutting 116a/ventilation hole 116b of the pellicle frame 114 during an exposure operation. The fallen particle issue may severely impinge on wafer yield.

Figure 3:
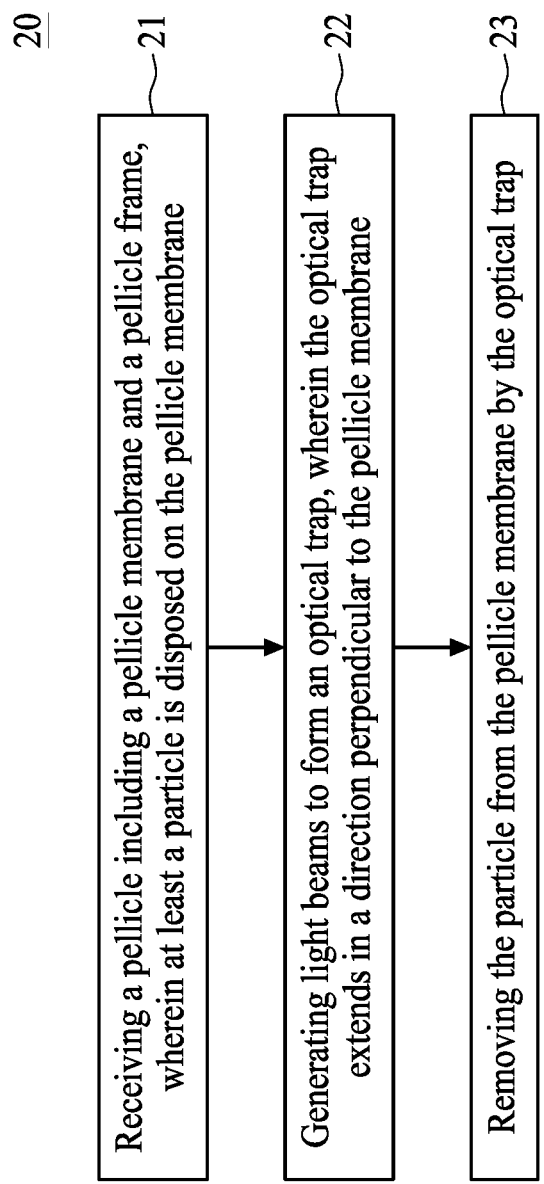
FIG. 3 is a flowchart representing a method for removing particles from a pellicle according to aspects of the present disclosure.

FIG. 3 is a flowchart representing a method for removing particle 20 according to aspects of the present disclosure, and FIGS. 4A to 4D are schematic drawings illustrating stages of the method for removing the particle 20 according to aspects of the present disclosure. In some embodiments, the method 20 is performed to remove particles from a pellicle membrane. The method 20 includes a number of operations (21, 22 and 23). The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

Figure 4A:
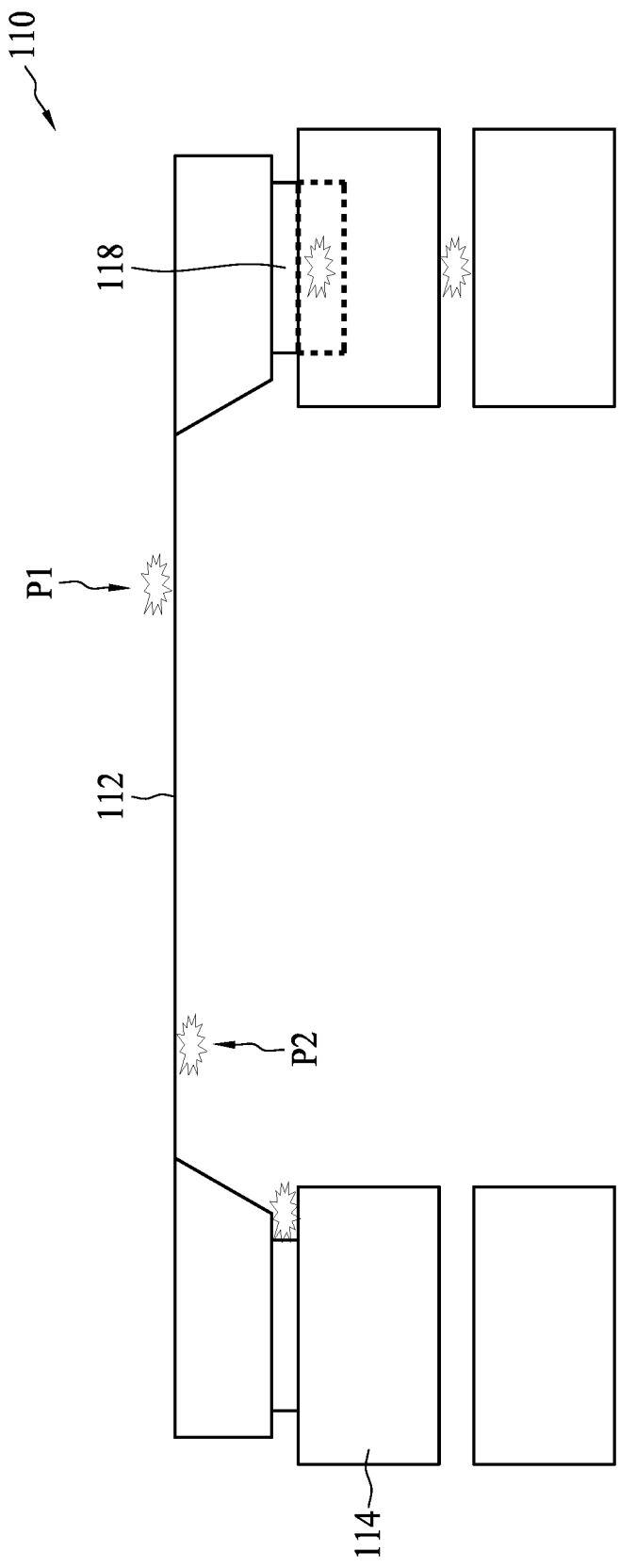

Referring to FIG. 4A, a pellicle 110 is received in operation 21. The pellicle 110 includes the pellicle membrane 112 and the pellicle frame 114. In some embodiments, particles P1 and P2 may be found over surfaces of the pellicle membrane 112, as shown in FIG. 4A. The particle P2 may fall on the surface that faces the pellicle frame 114, and the particle P1 may fall on the surface that faces opposite to the pellicle frame 114.

Figure 4B:
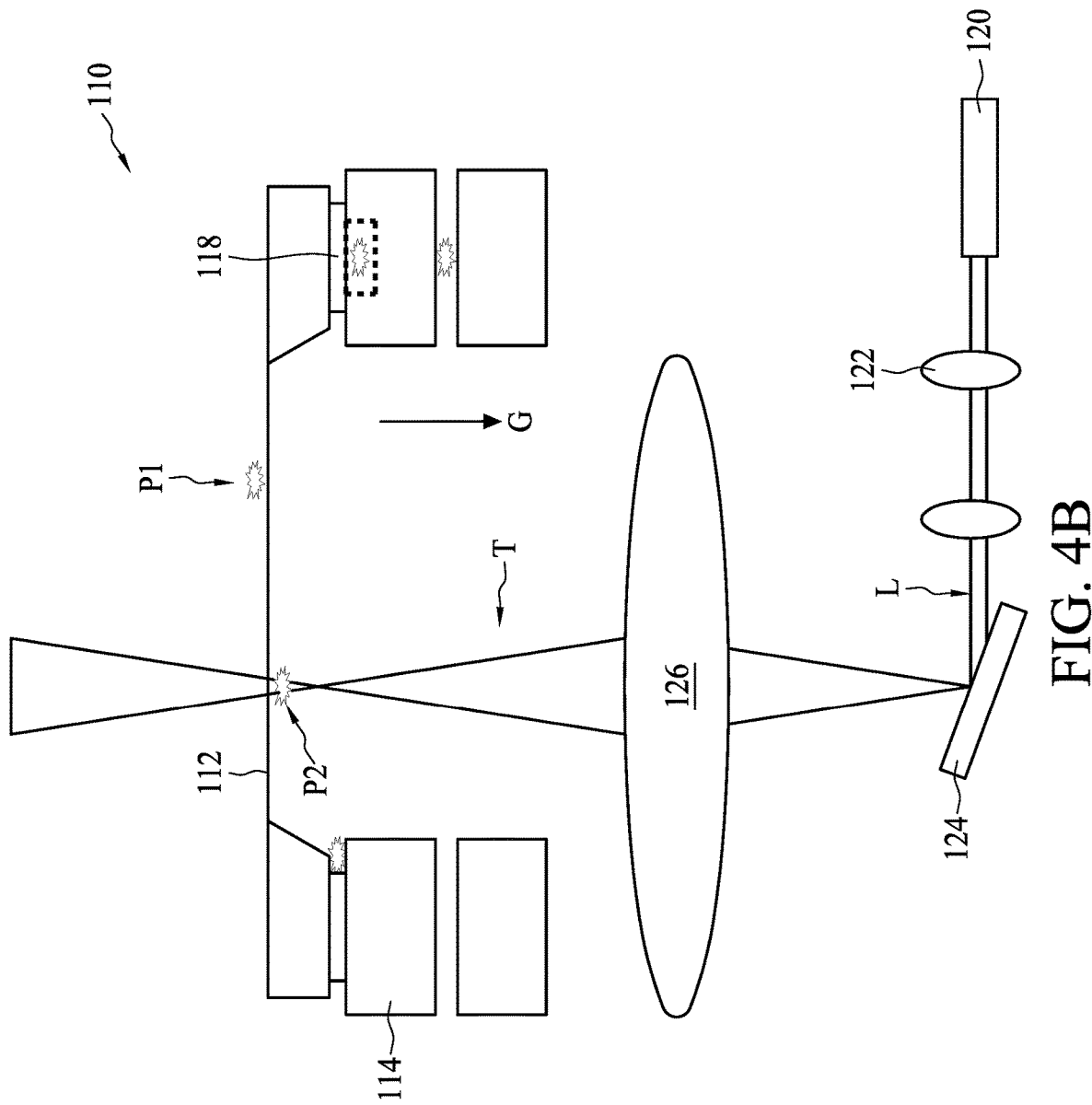

In operation 22, light beams L are generated to form an optical trap T. As shown in FIG. 4B, the optical trap T extends in a direction perpendicular to the pellicle membrane 112. In some embodiments, the optical trap T is formed along a direction from the particle P2 to the pellicle membrane 112. In some embodiments, the optical trap T extends along a direction opposite to a direction of gravitational force. The optical trap T is used to remove the particle P2. This technique relies on the forces created by one or more light beams L directed at a microscopic object in order to trap, levitate and move the microscopic object. As shown in FIG. 4B, the light beam L id emitted from a light source 120 such as a laser or an infrared (IR) light source, and through one or more lenses 122 if required. The light beam L may be directed to an object lens 126 through a spatial light modulator (SLM) 124. Because the light beam L is focused on a very small point (focal region), particles with high indices of refraction, such as glass, plastic, or oil droplets, are attracted to the intense regions of the light beam L and can be permanently trapped at the beam's focal region. Additionally, the particle P2 is between the pellicle membrane 112 and the object lens 126.

In operation 23, the particle P2 is removed from the pellicle membrane 112 by the optical trap T. Referring to FIG. 4C, a small Fresnel reflection may be developed at a surface of the trapped particle P2. This reflection of the trapping beam creates a radiation pressure force on the trapped particle P2 that moves it forward in the optical trap T. In some embodiments, the force may comply with an equation (1):

$$F_{scat} = \frac{n_b P_{scat}}{c} \qquad (1)$$
$$= \frac{I0}{c} \frac{128\pi^5 r^6}{3\lambda^4} \left(\frac{m^2-1}{m^2+2}\right) n_b$$

Here $F_{scat}$ indicates a scatter force of the optical trap T, $n_b$ indicates a reflective index of the medium, $P_{scat}$ indicates a scattered laser power, c indicates a speed of light, λ indicates wavelength of the laser beam L, and m indicates $n_{particle}/n_b$, wherein $n_{particle}$ indicates a reflective index of the particle P2.

In some embodiments, the wavelength λ is between approximately 500 nanometers and 520 nanometers, and a power of $P_{scat}$ is between approximately 100 mW and approximately 500 mW. The scatter force $F_{scat}$ of the optical trap T is able to capture and move particles with a diameter between approximately 15 micrometers and approximately 30 micrometers.

In some embodiments, the optical trap T extends along the direction opposite to the direction of gravitation force G. In other words, a vertical optical trap T is provided. In such embodiments, the gravitation force G and the vertical optical trap T together remove the particle P2 from the pellicle membrane 112.

Figure 4D:
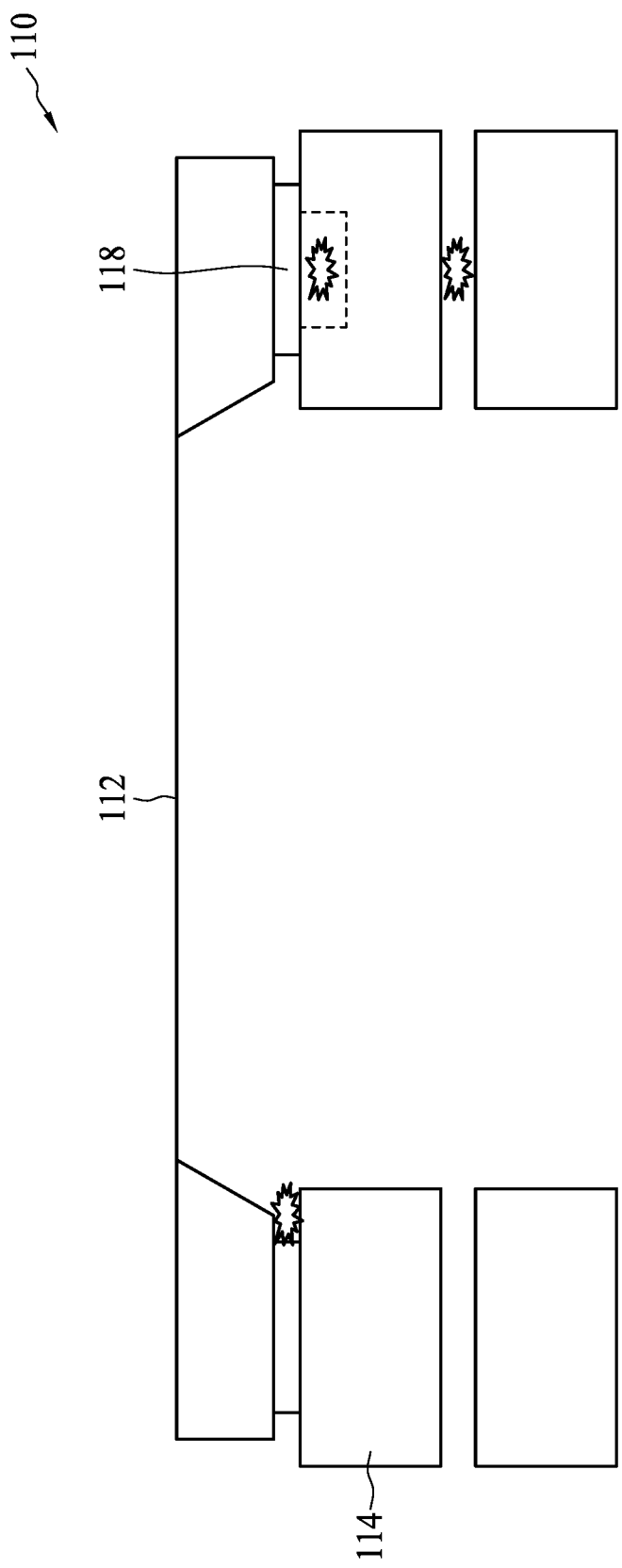

Referring to FIG. 4D, accordingly, the particle P2, while had fallen on the surface of the pellicle membrane 112 is removed. In some embodiments, to remove the particle P1, the pellicle 110 may be turned up side down such that the particle P1 is between the pellicle membrane 112 and the object lens 126. The operations 22 and 23 may be performed to remove the particle P1 from the pellicle membrane 112. In some embodiments, a vertical optical trap T and the gravitation force G together remove the particle P1 from the surface of the pellicle membrane 112. In some embodiments, by performing the operations 22 and 23 on both surfaces of the pellicle membrane 112, a particle issue of the pellicle membrane 112 is mitigated. Further, because particle removal is performed by the optical trap T, risk of damage to the pellicle membrane 112 such as scratch or rupture may be reduced.

Figure 5B:
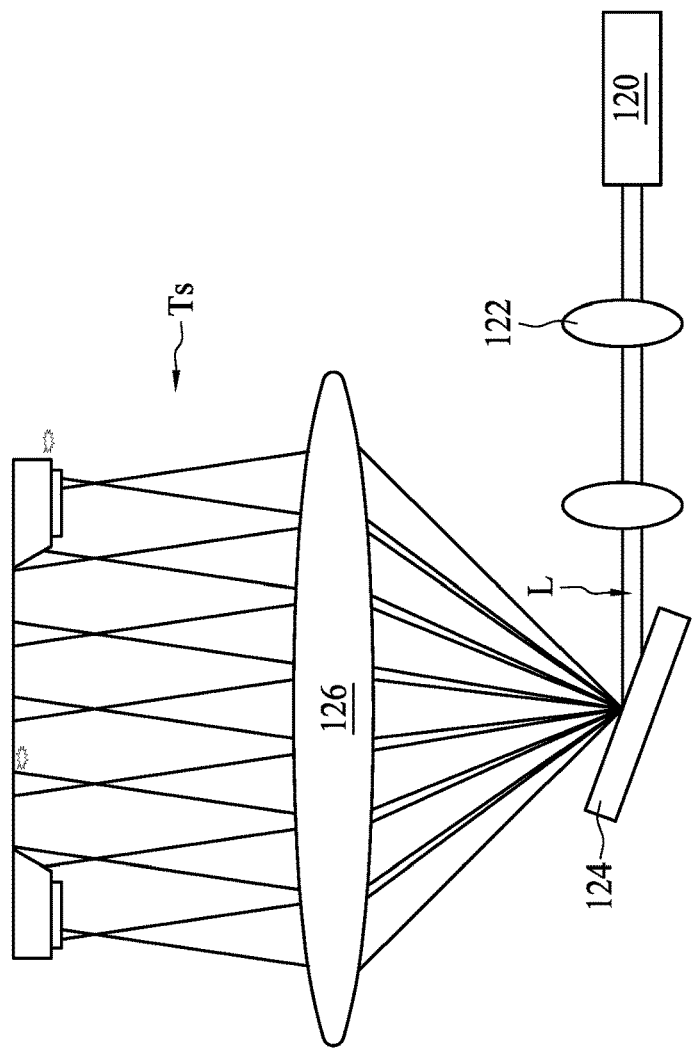
FIG. 5B is a side view of FIG. 5A.
Figure 5A:
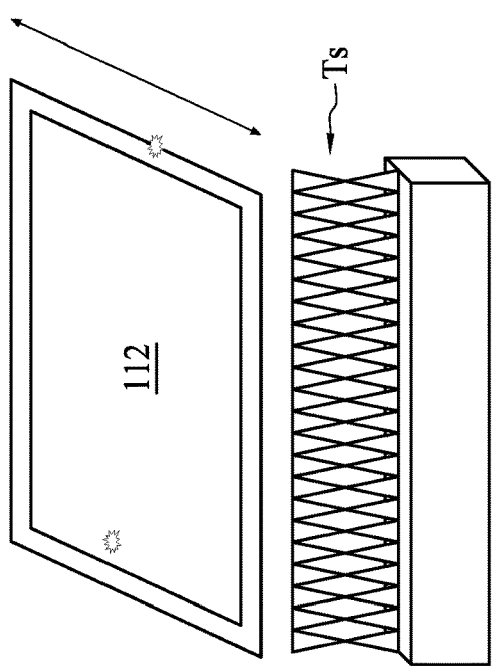
FIG. 5A illustrates a different embodiment of the method for removing particles according to aspects of the present disclosure.

Referring to FIGS. 5A and 5B, the optical trap T may be a linear-modularized multi-optical trap Ts. It should be noted that the light source 120, the lens 122, the SLM 124 and the objective lens 126 are omitted from FIG. 5A for brevity. In such embodiments, the linear-modularized multi-optical trap Ts may be used to scan the pellicle membrane 112 along a direction parallel to the surface of the pellicle membrane 112, such that a particle removal efficiency may be improved.

In some embodiments, the operations 22 and 23, i.e., the generating of the light beam L to form the optical trap T and the removing of the particles P1, P2 by the optical trap T are performed prior to attaching the pellicle 110 to the photomask substrate 102. For example, after attaching the pellicle membrane 112 to the pellicle frame 114 to form the pellicle 110 but prior to attaching the pellicle 110 to the photomask substrate 102, the operations 22 and 23 may be performed, such that the issue of fallen particles on the photomask substrate 102 is mitigated.

In some embodiments, the operations 22 and 23, i.e., the generating of the light beam L to form the optical trap T and the removing of the particles P1, P2 by the optical trap T, are performed after the attaching of the pellicle 110 to a photomask substrate 102. For example, after disposing the pellicle 110 on the photomask substrate 102, particles P1 may fall on the external-facing surface of the pellicle membrane 112. In such embodiments, operations 22 and 23 may be performed on the surface of the pellicle membrane 112, thus mitigating the issue of fallen particles on the photomask substrate 102.

In some embodiments, prior to the disposing of the pellicle 110 on the photomask substrate 102, the light beam L may include laser light beams or infrared (IR) light beams. A wavelength of the IR light beams may be between approximately 800 nanometers to 2,500 nanometers. In other embodiments, after the disposing of the pellicle 110 on the photomask substrate 102, the light beam may include IR light beams in order to prevent damage to the absorber pattern 104 or the layers (i.e., the capping layer and the Mo—Si multi-layers).

Figure 6:
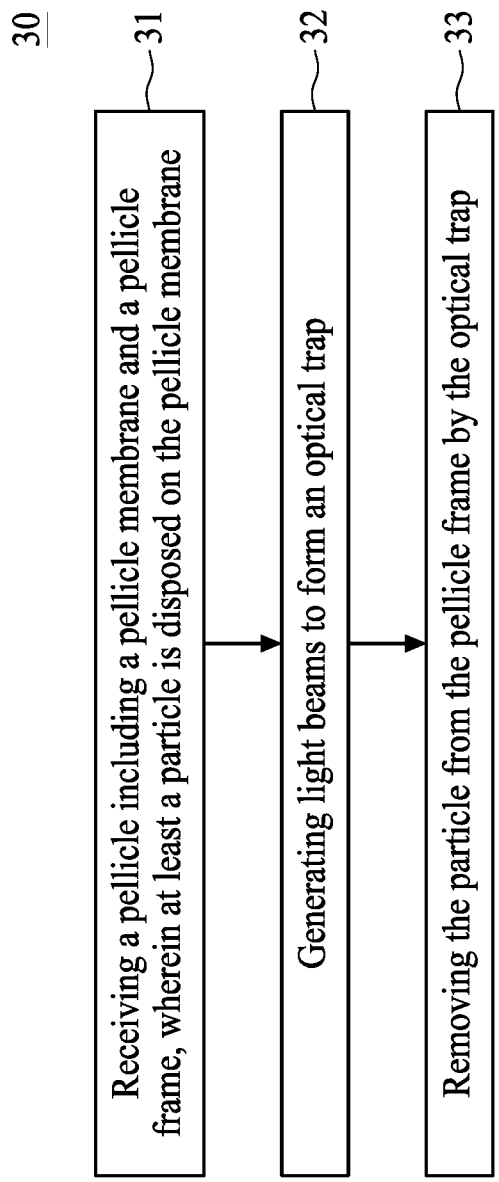
FIG. 6 is a flowchart representing a method for removing particles from a photomask according to aspects of the present disclosure.
Figure 7A:
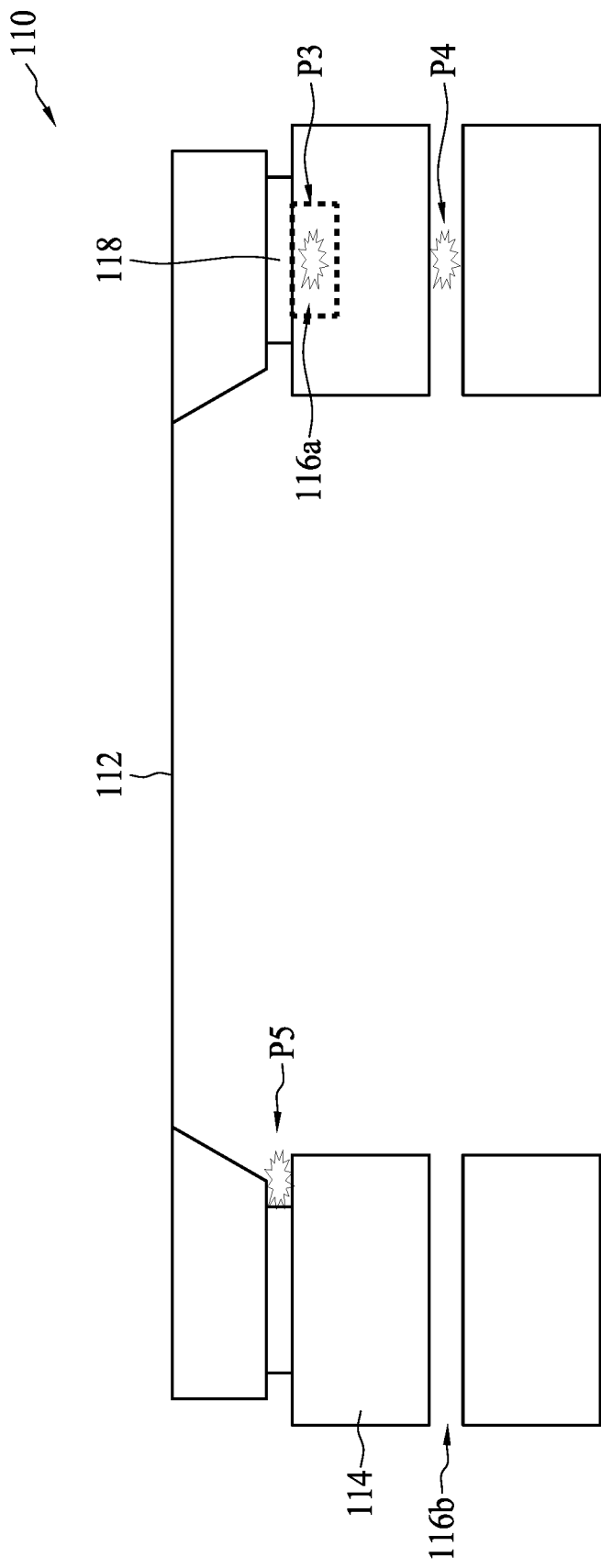
FIGS. 7A to 7C are schematic drawings illustrating stages of the method for removing particles according to aspects of the present disclosure.
Figure 7B:
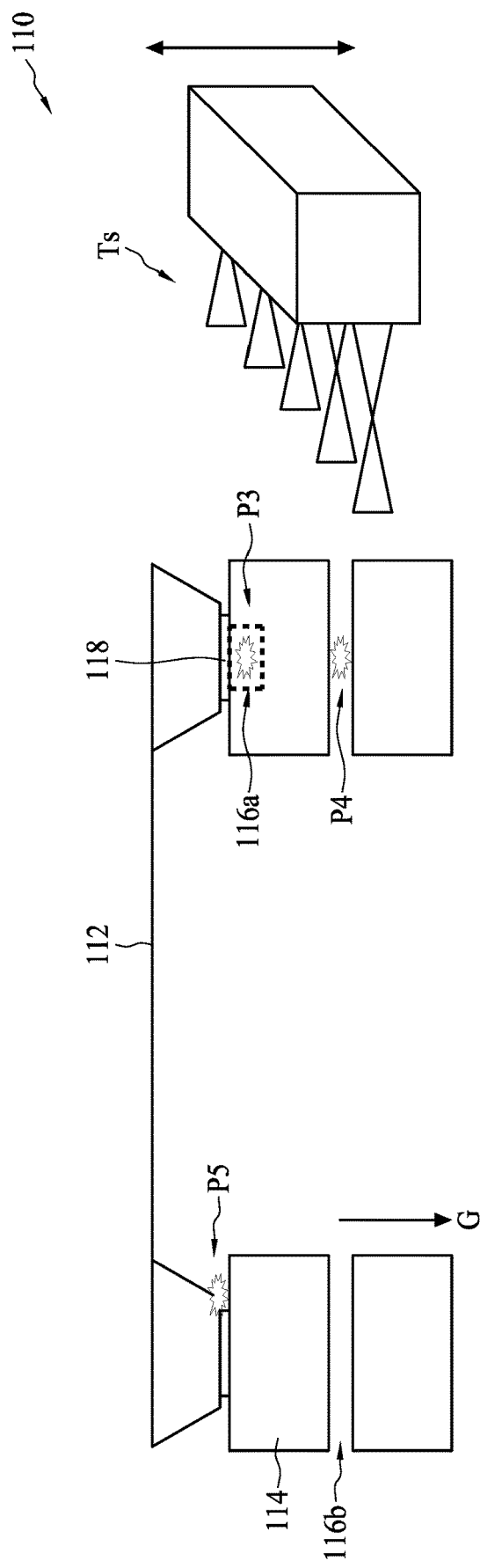
Figure 7C:
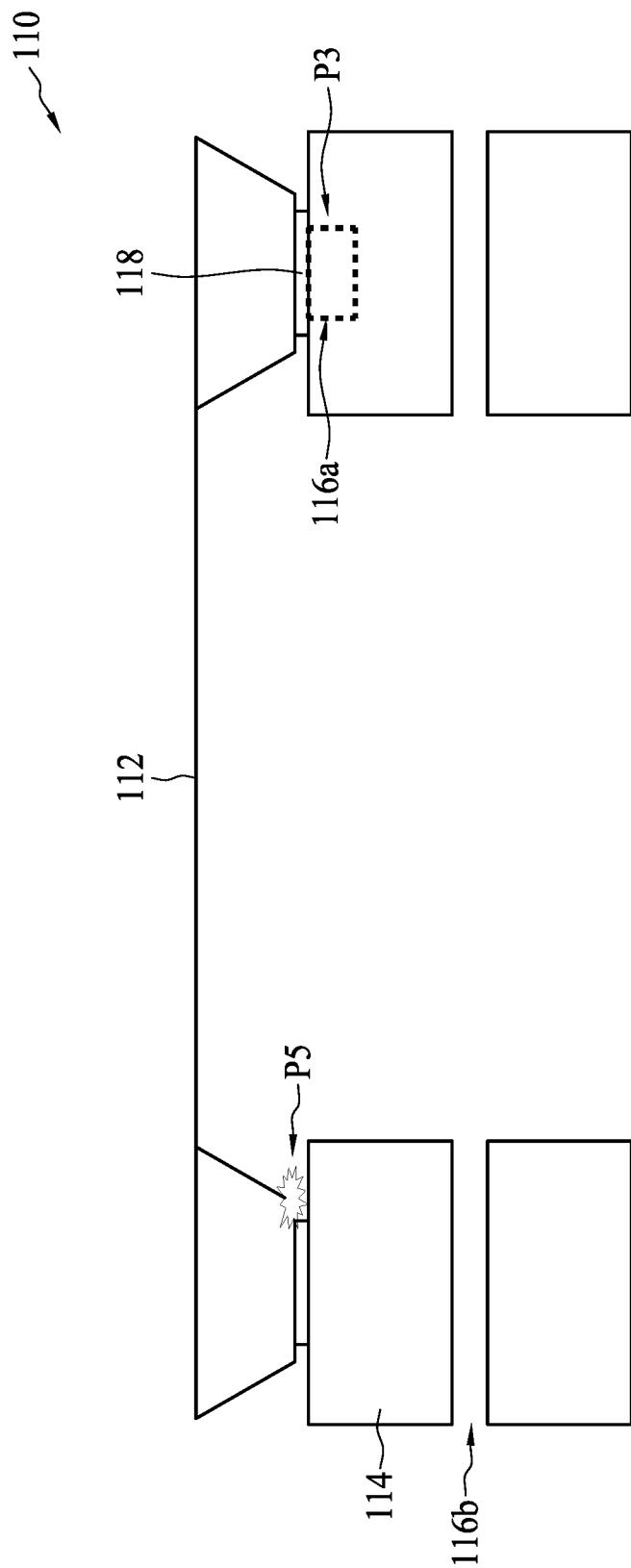

FIG. 6 is a flowchart representing a method for removing a particle 30 according to aspects of the present disclosure, and FIGS. 7A to 7C are schematic drawings illustrating stages of the method for removing the particle 30 according to aspects of the present disclosure. It should be noted that same elements in FIGS. 7A to 7C and FIGS. 4A to 4D may include same materials and are indicated by the same numerals; therefore, repeated descriptions are omitted for brevity. The method 30 includes a number of operations (31, 32 and 33). The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may be only briefly described herein. Thus, other implementations are possible within the scope of the various aspects described herein.

Referring to FIGS. 6 and 7A, a pellicle 110 is received in operation 31. The pellicle 110 includes the pellicle membrane 112 and the pellicle frame 114. In some embodiments, particles P3, P4, P5 may be found over the pellicle frame 114, as shown in FIG. 7A. For example, the particle P3 may fall on and accumulate in the cutting 116a of the pellicle frame 114, the particle P4 may fall on and accumulate in the ventilation hole 116b of the pellicle frame 114, and the particle P5 may fall on a junction between the pellicle membrane 112 and the pellicle frame 114.

In operation 32, light beams L are generated to form an optical trap T. In some embodiments, the optical trap T extends in a direction perpendicular to the pellicle frame 114. In some embodiments, the light beams L are directed in a direction perpendicular to the gravitational force G. In such embodiments, the optical trap may be referred to as a horizontal optical trap T. The horizontal optical trap T is used to remove the particles P3, P4. As mentioned above, this technique relies on the forces created by one or more light beams L directed at a microscopic object in order to trap, levitate and move that microscopic object. It should be noted that the light beams L are emitted from a light source such as a laser or an infrared (IR) light source, and, if required, through a lens. The light beams L may be directed to an object lens through a spatial light modulator. The arrangement of the light source, the lens, and the spatial light modulator may be similar to that shown in FIG. 4B; thus, repeated descriptions of such elements are omitted. In some embodiments, the optical trap may be a linear-modularized multi-optical trap Ts as shown in FIG. 7B, but the disclosure is not limited thereto. In such embodiments, the linear-modularized multi-optical trap Ts may be used to scan the pellicle frame 114 along a direction parallel to the direction of gravitational G, such that a particle removal efficiency may be improved.

In operation 33, the particles P3, P4 are removed from the pellicle frame 114 by the optical trap T. A small Fresnel reflection may be developed at a surface of the trapped particles P3, P4. This reflection of the trapping beam creates a radiation pressure force on the trapped particles P3, P4 that moves the trapped particles P3, P4 forward in the optical trap T. In some embodiments, the force may comply with the equation (1) as mentioned above.

Referring to FIG. 7C, accordingly, the particle P3 is removed from the cutting 116a of the pellicle frame 114, and the particle P4 is removed from the ventilation hole 116b of the pellicle frame 114. By the performing of the operations 32 and 33, the particle issue of the pellicle frame 114 is mitigated. Further, because particle removal is performed by the optical trap Ts, risk to the pellicle frame 114 may be reduced.

Figure 8:
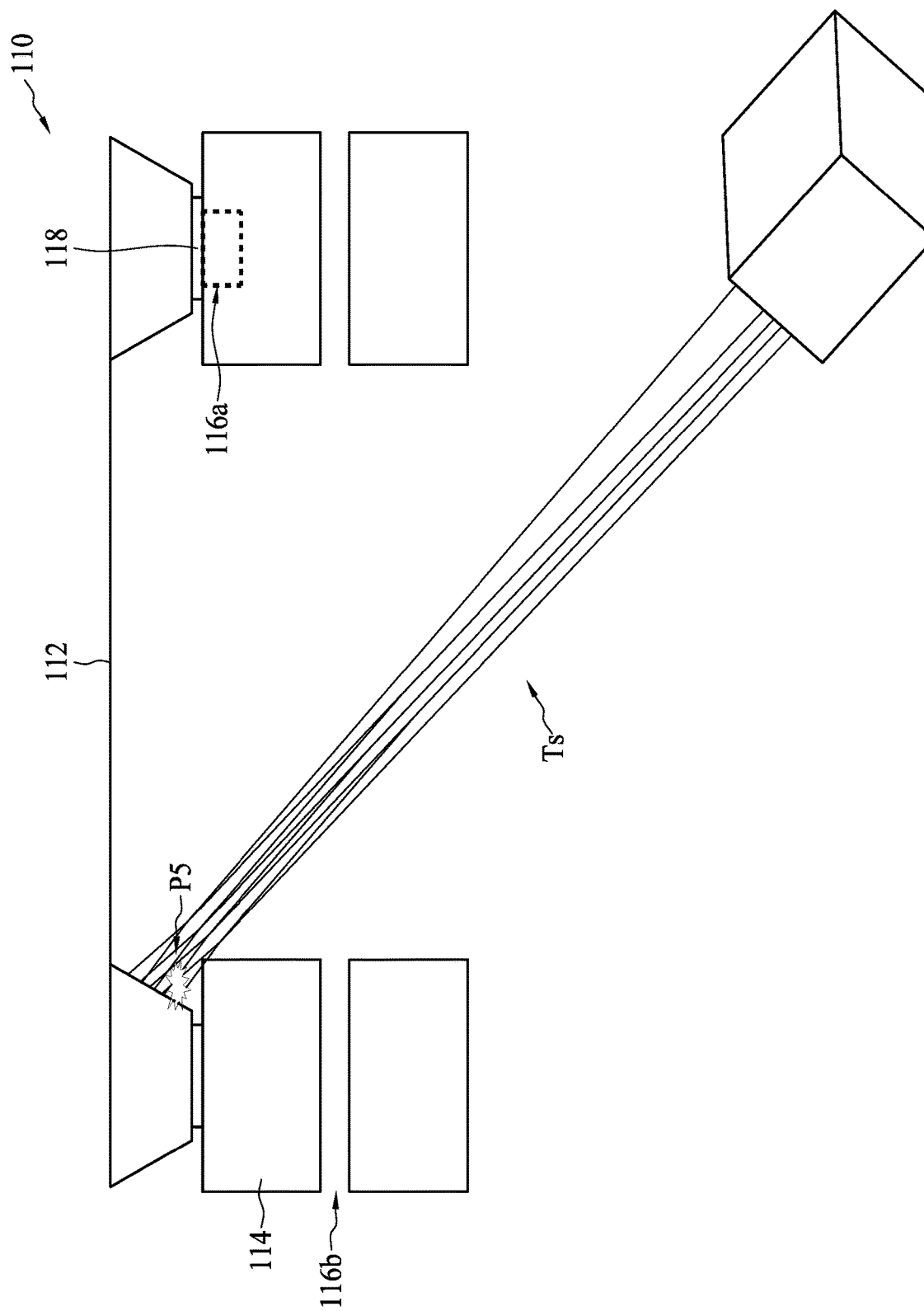
FIG. 8 illustrates another embodiment of the method for removing particles according to aspects of the present disclosure.

Referring to FIG. 8, in some embodiments, the optical trap T extends in a direction, and the direction and the pellicle membrane 112 form an included angle of less than 90 degrees. In such embodiments, the optical trap T may be referred to as a tilted optical trap T. Further, the trap T may be a linear-modularized multi-optical trap Ts. It should be noted that the light source 120, the lens 122, the SLM 124 and the objective lens 126 are omitted from FIG. 8. In some embodiments, the tilted optical trap T is used to remove the particle P5 from the junction between the pellicle membrane 112 and the pellicle frame 114.

In some embodiments, the operations 32 and 33, i.e., the generating of the light beams L to form the optical trap T and the removing of the particles P3, P4, P5 by the optical trap are performed prior to attaching the pellicle 110 to the photomask substrate 102. For example, after the pellicle membrane 112 is attached to the pellicle frame 114 to form the pellicle 110, but prior to the attaching of the pellicle 110 to the photomask substrate 102, the operations 32 and 33 may be performed, such that the particle issue may be mitigated and thus the fall-on particle issue to the photomask substrate 102 is mitigated.

In some embodiments, the operations 32 and 33, i.e., the generating of the light beams L to form the optical trap T and the removing of the particles P3, P4, P5 by the optical trap T, are performed after the pellicle 110 is attached to a photomask substrate 102, thus mitigating the issue of fallen particles on the photomask substrate 102.

As mentioned above, prior to the disposing of the pellicle 110 on the photomask substrate 102, the light beam L may include laser light beams or IR light beams. As mentioned above, a wavelength of the IR light beams may be between approximately 800 nanometers to 2,500 nanometers. In other embodiments, after the disposing of the pellicle 110 on the photomask substrate 102, the light beam may include IR light beams in order to prevent damage to the absorber pattern 104 or the layers (i.e., the capping layer and the Mo—Si multi-layers).

In some embodiments, the method 20 for removing the particle from the pellicle membrane 112 and the method 30 for removing the particle from the pellicle frame 114 and from the junction between the pellicle membrane 112 and the pellicle frame 114 may be both performed on the pellicle 110. In some embodiments, the method 20 may be performed prior to the method 30 or, alternatively, after the method 30, depending on different process requirements. In some embodiments, the method 20 and the method 30 may be performed concurrently, depending on different process requirements.

Figure 9:
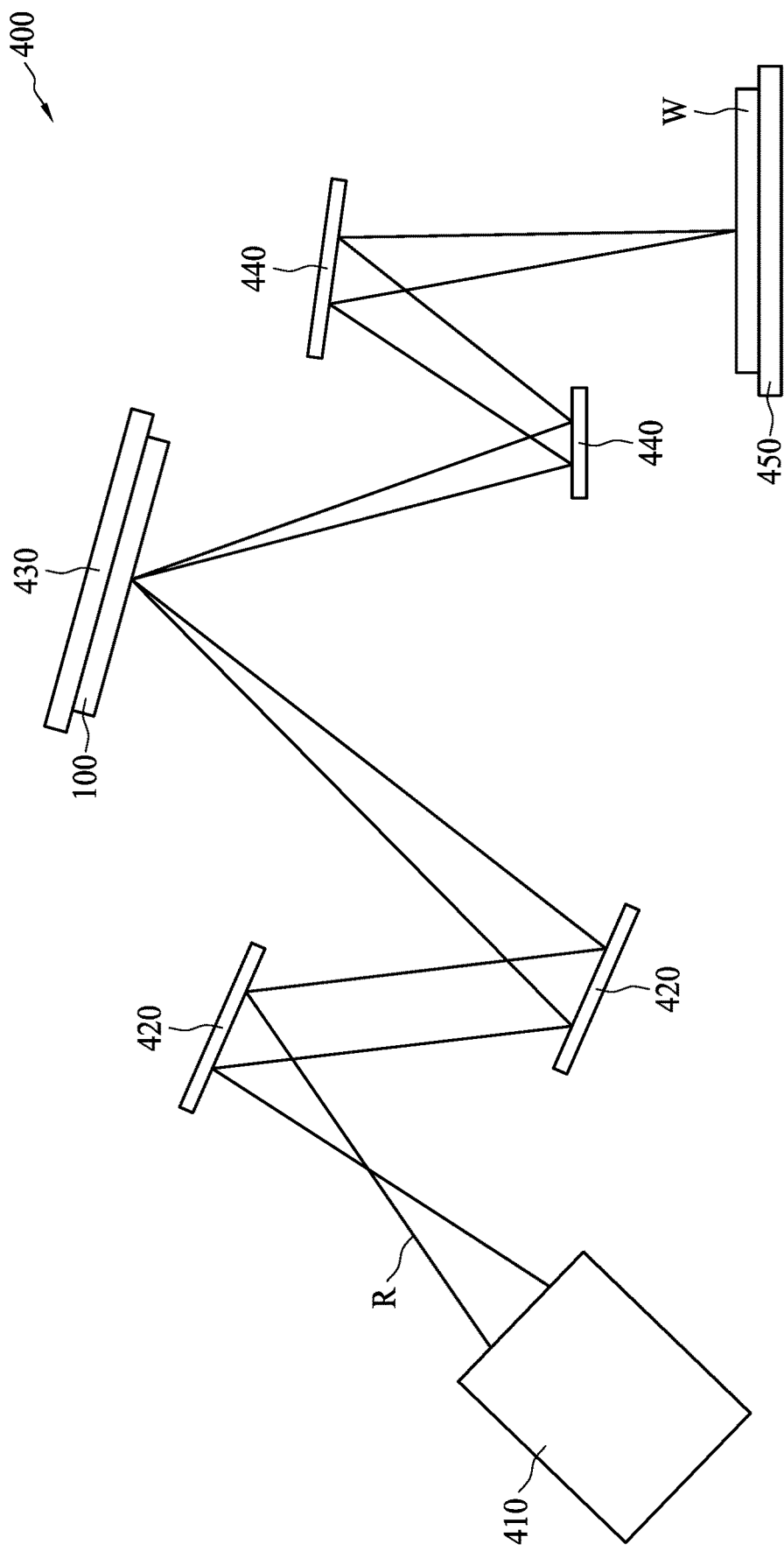
FIG. 9 is a schematic view of a lithography system according to aspects of the present disclosure.

Please refer to FIG. 9, which is a schematic view of a lithography system 400 according to aspects of the present disclosure. In some embodiments, the abovementioned photomask 100, after the performing of the method 20 and/or the method 30, is utilized within the lithography system 400.

The lithography system 400 may be referred to as a scanner that is operable to perform lithographic processes including exposure. In some embodiments, the EUV lithography system 400 may also be referred as a scanner, which is operable to perform lithography processes through EUV radiation R. In some embodiments, the EUV lithography system 400 includes an EUV light source module 410, which is configured to generate the EUV radiation R. For example, the EUV radiation R may have a wavelength between about 1 nm and about 100 nm. In some embodiments, the EUV radiation R may have a wavelength about 13.5 nm, but the disclosure is not limited thereto The EUV lithography system 400 employs an EUV photomask 100, as mentioned above, to reflect the EUV radiation R. Hence, the circuitry pattern on the EUV photomask 100 may be precisely duplicated onto a target wafer W by exposing a photoresist on the target wafer W to the EUV radiation R.

In some embodiments, the lithography system 400 includes an illuminator 420. The illuminator 420 includes a variety of optic components, such as a refractive optics system having multiple lenses and/or a reflective optics system having multiple mirrors, so as to direct the EUV radiation R from the EUV light source module 410 toward a mask stage 430, on which the EUV photomask 100 is held. Additionally, the mask stage 430 is configured to secure the EUV photomask 100. In some embodiments, the mask stage 430 is an electrostatic chuck (also known as an S-chuck or an R-chuck), which may hold the EUV photomask 100 through an attraction force therebetween. Since even a gas molecule may absorb the EUV radiation R and lower its intensity, the lithography system 400 is designed to be positioned in a vacuum environment to avoid intensity loss of the EUV radiation R. The electrostatic chuck merely utilizes the attraction force to hold the EUV photomask 100, such that the use of the electrostatic chuck does not result in presence of particles and/or gas molecules.

In some embodiments, the lithography system 400 includes a projection optics module 440 (also known as a projection optics box (POB)). The projection optics module 440 is configured to transfer the circuitry pattern of the EUV photomask 100 onto the target wafer W secured by a wafer stage 450 after the EUV radiation R is reflected by the EUV photomask 100. The projection optics module 440 includes a variety of refractive optics and/or reflective optics arranged based on various designs. The EUV radiation R, which is reflected by the EUV photomask 100 and carries the circuitry pattern thereon, is directed toward the target wafer W by the projection optics module 440. Hence, due to the configurations of the illuminator 420 and the projection optics module 440, the EUV radiation R may be focused on the EUV photomask 100 and the target wafer W with suitable properties, such as intensity and clearness.

Figure 10:
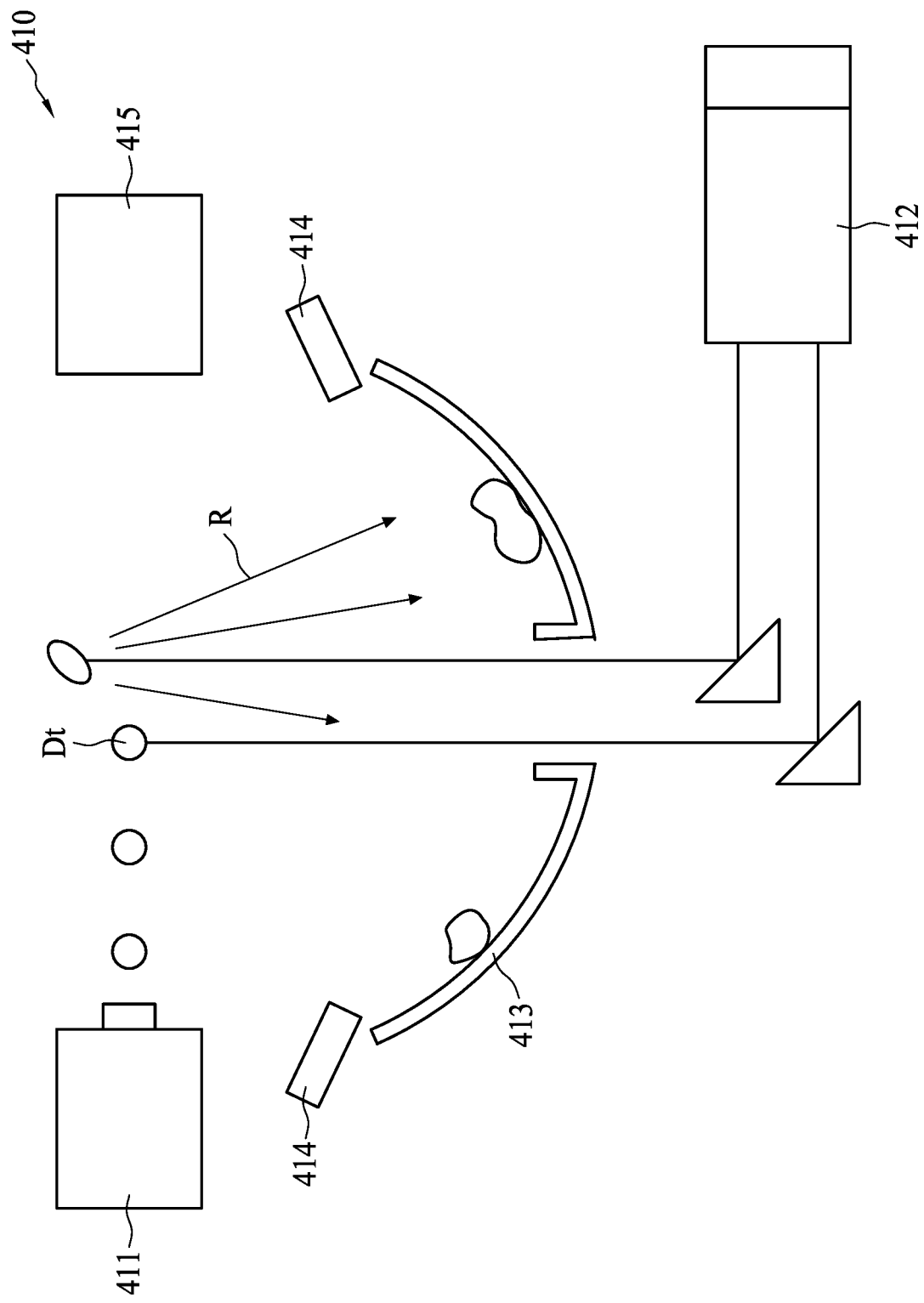
FIG. 10 is a schematic diagram illustrating the EUV light source module in accordance with some embodiments of the present disclosure.

Referring to FIG. 10, the EUV light source module 410 includes a droplet generator 411, a laser source 412, a light collector 413, a gas supply 414, and a droplet catcher 415. It should be noted that components of the EUV light source module 410 may be further added or omitted based on various designs.

The droplet generator 411 generates a plurality of target droplets Dt. The target droplets Dt may have at least one material among a group including tin (Sn), tin containing liquid material such as eutectic tin alloy, lithium (Li), xenon (Xe), combinations thereof, or the like. In some embodiments, the target droplet Dt may have a diameter of about 30 microns (μm), but the disclosure is not limited thereto. In some embodiments, the target droplets Dt are generated one at a time with substantially the same period between two contiguous target droplets Dt.

The laser source 412 produces a variety of lasers for exciting the target droplets Dt to further generate a plurality of EUV radiations R used in EUV lithography process. In some embodiments, the laser source 412 may employ a dual pulse laser-produced plasma (LPP) mechanism. For example, the laser source 412 may utilize two types of lasers, such as the pre-pulse laser and the main-pulse laser, for generating the EUV radiations R from the target droplets Dt.

The light collector 413 collects the EUV radiation R emitted by the plasma. More specifically, the light collector 413 may sequentially collect, reflect, and direct the EUV radiation R for the EUV lithography operation. The light collector 413 is configured with appropriate coating material and shape so as to function as a mirror for collection, reflection, and focus of the EUV radiation R. In some embodiments, the light collector 413 has an ellipsoidal geometry, e.g., a bowl shape. Further, the light collector 413 has a through hole at its center for allowing laser beams from the laser source 412 to pass through.

The gas supply 414 is in fluid communication with a chamber in which the EUV light source module 410 is positioned, and the gas supply 414 is configured to provide hydrogen gas to the light collector 413. Hydrogen gas has low ability to absorb the EUV radiation R, so the intensity of the EUV radiation R may not be influenced significantly. The droplet catcher 415 is opposite to and aligned with the droplet generator 411. In some embodiments, the droplet catcher 415 is configured to receive excessive target droplets Dt and some debris. In some embodiments, the droplet catcher 415 may retrieve the missed target droplets Dt and avoid wasting the target droplets Dt.

Figure 11:
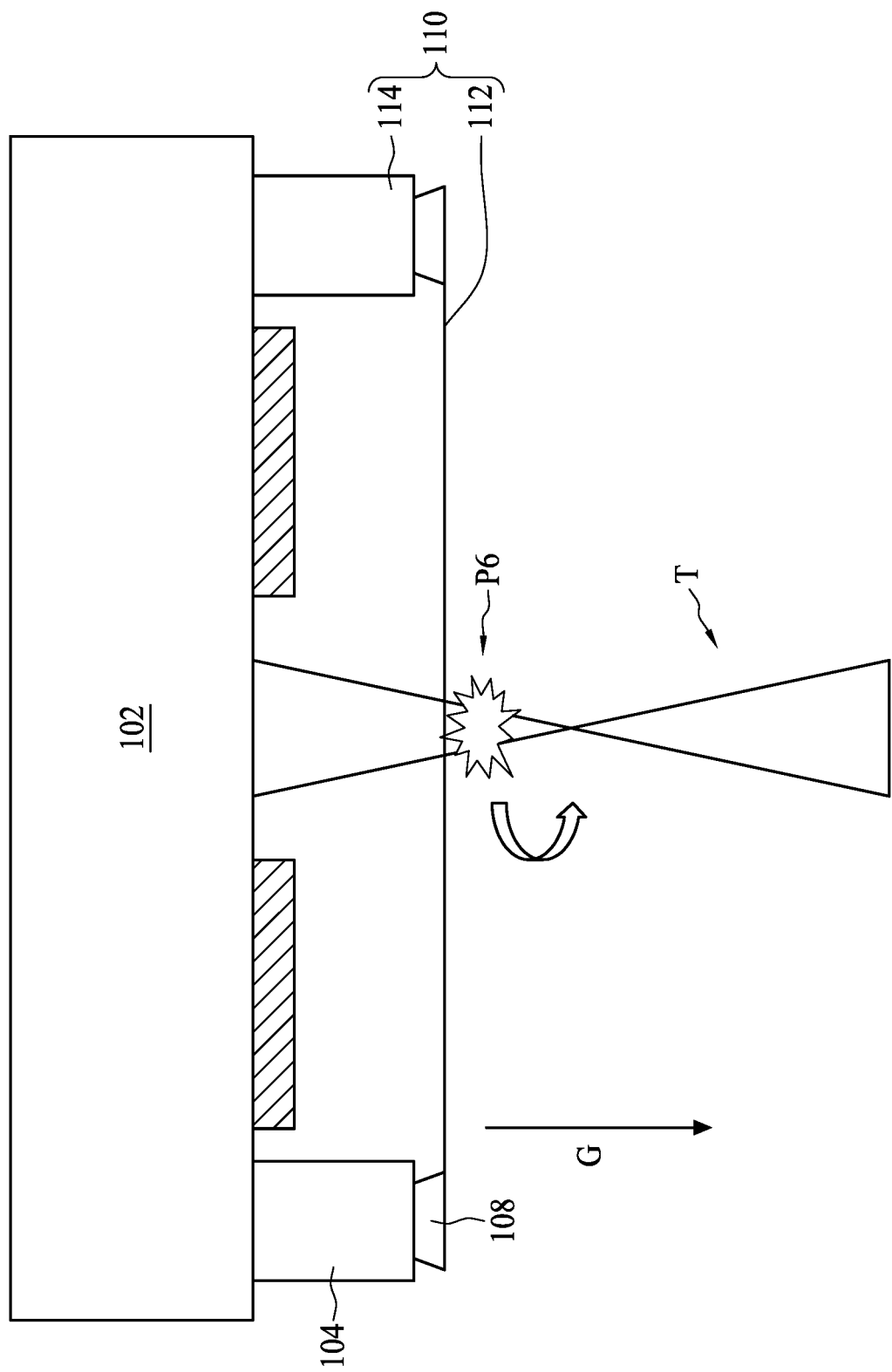
FIG. 11 is a schematic drawing illustrating the method for removing particles according to aspects of the present disclosure.

Referring to FIG. 11, in some embodiments, particles generated during the performing of the exposure operation may be unintentionally deposited on a surface of the pellicle membrane 112 or the pellicle frame 114 of a pellicle type photomask 100. In some embodiments, the target droplet Dt may fall on the surface of the pellicle membrane 112 in a form of a particle P6, such as a tin ball. Additionally, the debris may fall on the surface of the pellicle membrane 112. Both the particles P6 and the debris, if not removed, result in degradation of lithographically transferred patterns. In such embodiments, the method 20 and the method 30 may be performed individually or in combination to remove the particles P6. Because the particle issue of the pellicle 110 is mitigated by the methods 20 and 30, the photomask 100 cleanness is improved, and thus repair for the photomask 100 due to the particles falling on the photomask 100 may be ignored.

Additionally, in such embodiments, an IR light source may be used to form the optical trap T in order to reduce the damage to the absorber pattern 104 of the photomask 100.

Figure 12:
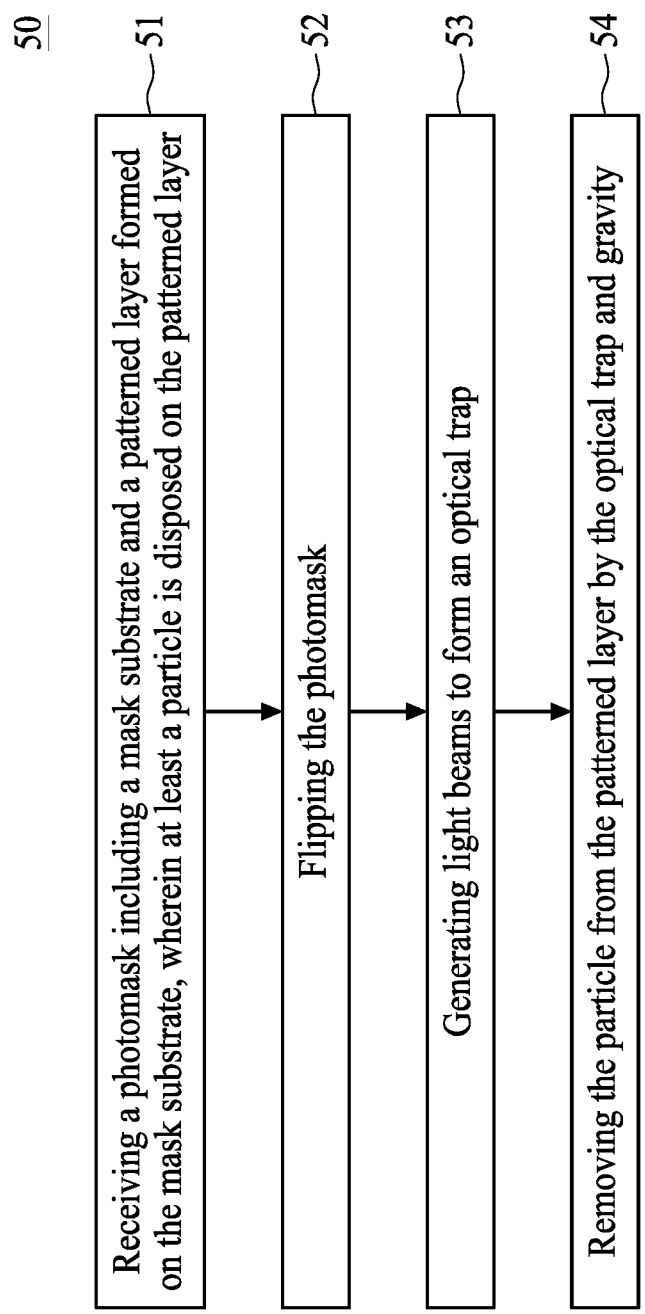
FIG. 12 is a flowchart representing a method for removing particles from a photomask according to aspects of the present disclosure.

FIG. 12 is a flowchart representing a method for removing particle 50 according to aspects of the present disclosure, and FIGS. 13A to 13D are schematic drawings illustrating stages of the method for removing the particle 50 according to aspects of the present disclosure. It should be noted that same elements in FIGS. 13A to 13D and FIGS. 4A to 4D may include same materials and are indicated by the same numerals; therefore, repeated descriptions are omitted for brevity. In some embodiments, the method 50 is performed to remove particles from the pellicle membrane. The method 50 includes a number of operations (51, 52, 53 and 54). The method 50 will be further described according to one or more embodiments. It should be noted that the operations of the method 50 may be rearranged or otherwise modified within the scope of the various aspects. It should be further noted that additional processes may be provided before, during, and after the method 50, and that some other processes may be only briefly described herein. Thus, other implementations are possible within the scope of the various aspects described herein.

Referring to FIG. 13A, a photomask 100 is received in operation 51. In some embodiments, the photomask 100 is received from an EUV scanner chamber. In some embodiments, the photomask 100 is a non-pellicle type photomask. In such embodiments, the photomask 100 is free of the pellicle. In such embodiments, the absorber pattern 104 and the photomask substrate 102 may be exposed to the environment during an exposure operation in a chamber, such as that shown in FIGS. 9 and 10.

In some embodiments, in a scanner chamber as shown in FIGS. 9 and 10, particle P7, in a form of a tin ball, which is generated from the droplet generator 411, may fall on the surface of the absorber pattern 104 and the photomask substrate 102. In such embodiments, the particle P7 is more difficult to remove due to high friction between the particle P7 and the absorber pattern 104.

Figure 13B:
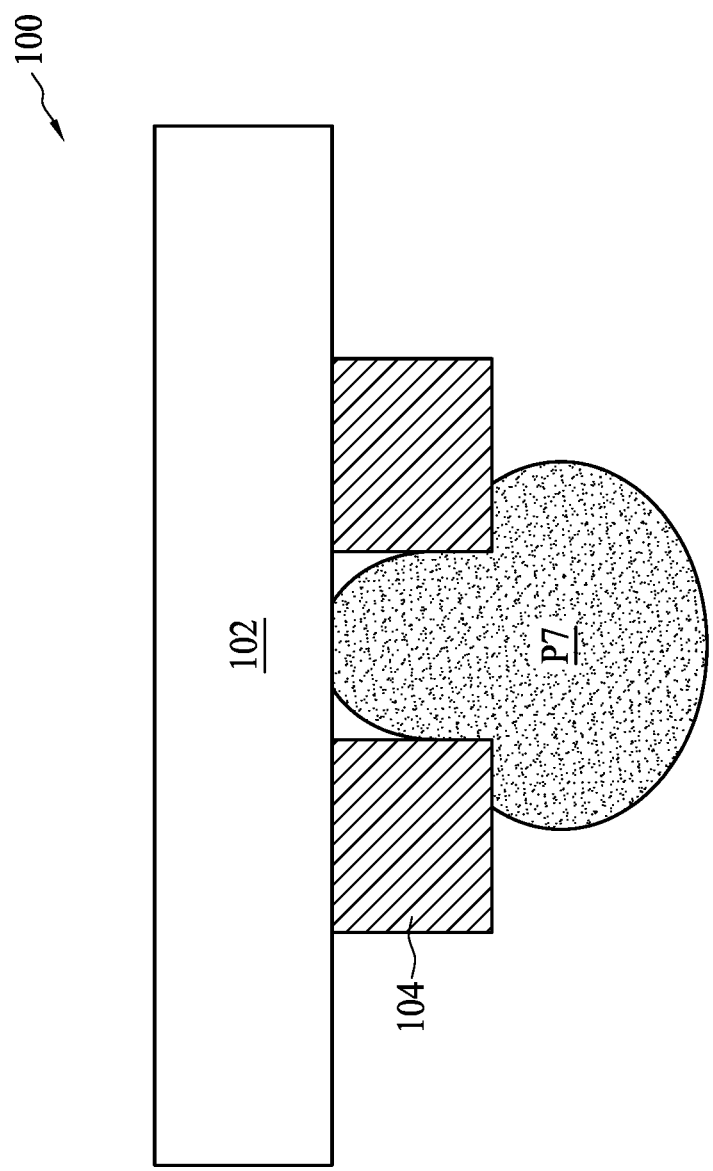

Referring to FIG. 13B, the photomask 100 is flipped up-side down in operation 52.

Figure 13C:
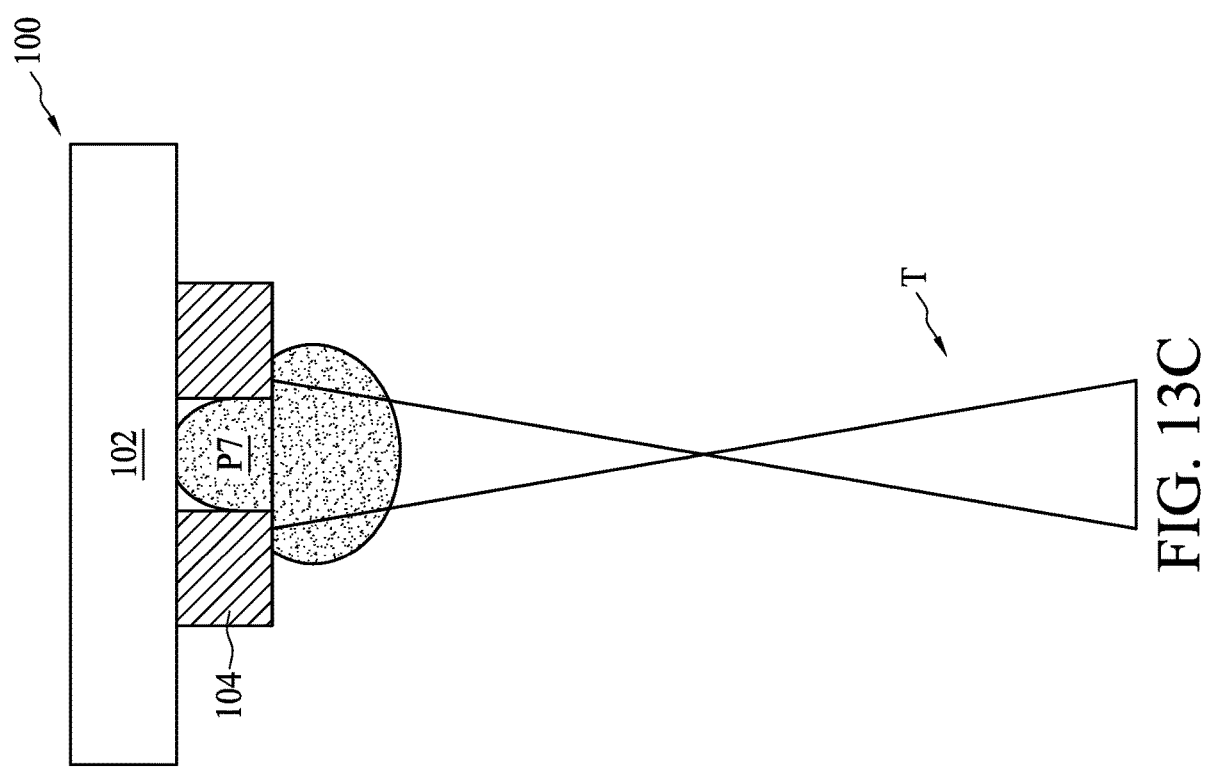

In operation 53, a light beam L is generated to form an optical trap T. As shown in FIG. 13C, the optical trap T extends in a direction perpendicular to a surface of the absorber pattern 104 and a surface of the photomask substrate 102. Further, the optical trap T extends along a direction opposite to the direction of gravitation force G. The optical trap T is used to remove the particle P7. As mentioned above, this technique relies on the forces created by one or more light beams by a microscopic object in order to trap, levitate and move that microscopic object. In some embodiments, the light beams are emitted from a light source such as a laser or an infrared (IR) light source, and if required, through a lens. The light beams may be directed to an object lens through a spatial light modulator (SLM). The arrangement of the light source, the lens, and the spatial light modulator may be similar to that shown in FIG. 4B; thus, repeated descriptions of such elements are omitted. Because the light beams L are focused to a very small point (focal region), particles with high indices of refraction, such as glass, plastic, or oil droplets, are attracted to the intense regions of the laser beams and can be trapped at the beams' focal region.

Figure 13D:
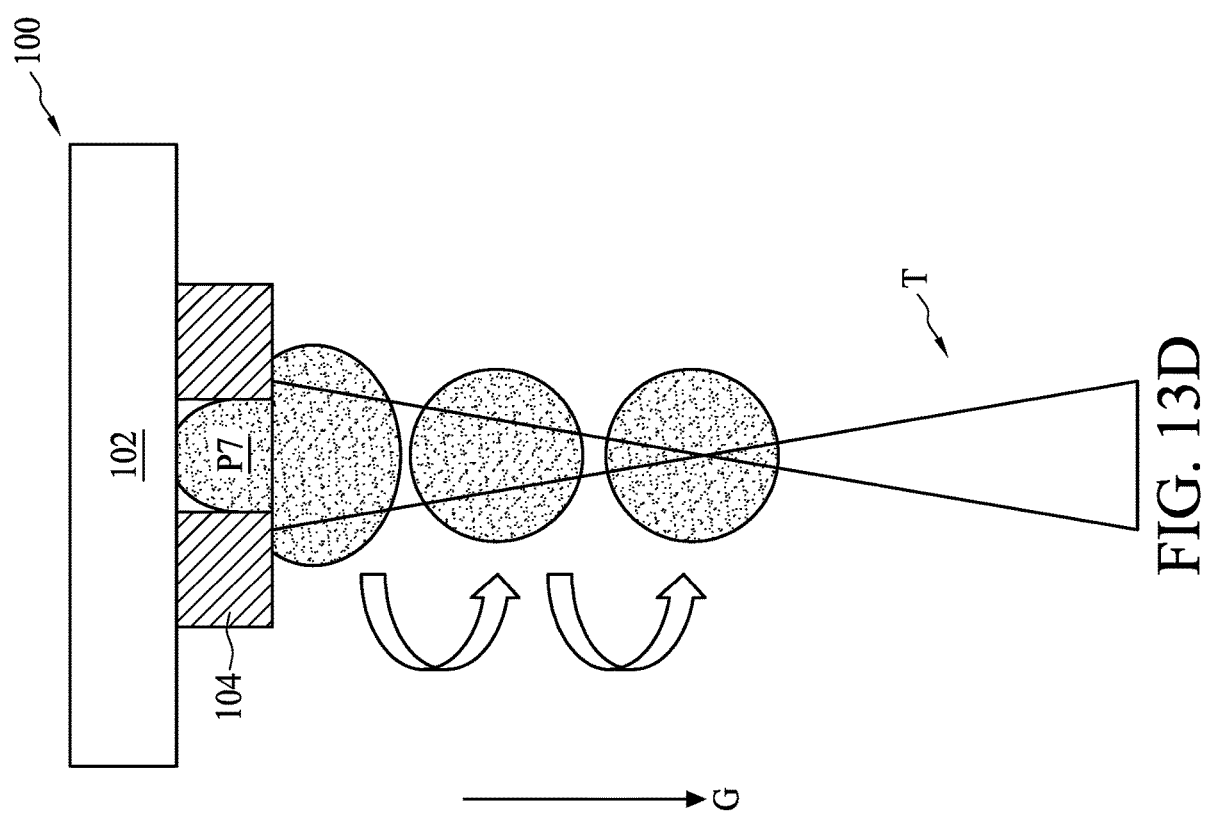

In operation 54, the particle P7 is removed from the photomask substrate 102 by the optical trap T. Referring to FIG. 13D, a small Fresnel reflection may be developed at a surface of the trapped particle P7. This reflection of the trapping beam creates a radiation pressure force on the trapped particle P7 that moves it forward in the optical trap T. In some embodiments, the optical trap T extends along the direction opposite to the direction of gravitational force G, and the optical trap T may be referred to as a vertical optical trap T. In other words, the particle P7 is removed from the absorber pattern 104 by the vertical optical trap T and the gravitational force G. Additionally, the optical trap T may be a linear-modularized multi-optical trap.

In some embodiments, the light beams may help melt the particle P7 (i.e., the tin ball), such that the friction between the particle P7 and the absorber pattern 104 is reduced, and the particle removal efficiency may be improved.

In some embodiments, a continuous wave laser is used to provide energy to melt the particle P7 such that the friction between the particle P7 and the absorber 104 is reduced, and thus the particle removal efficiency may be improved. Accordingly, the particle issue may be mitigated and thus the issue of fallen particles on the photomask 100 is mitigated.

In summary, the present disclosure provides a method for removing a particle from pellicle and from a photomask. The method uses an optical trapping technology for quick particle removal. In some embodiments, a vertical light trap may be provided according to the optical trapping technology to remove particles from a pellicle membrane. In some embodiments, a horizontal trap may be provided according to the optical trapping technology to remove the particles from the pellicle a frame cutting and from ventilation holes. In some embodiments, a tilted trap may be provided according to the optical trapping technology to remove the particles from a junction between a pellicle membrane and a pellicle frame. In some embodiments, the photomask may be turned upside down, such that method using the optical trapping technology and a gravitational force together remove the particles from the photomask substrate. According to the method, the particles may be efficiently removed and thus a fallen particle issue may be mitigated. Further, use of the optical trapping technology causes little damage to the pellicle membrane, the pellicle frame and the photomask substrate.

According to one embodiment of the present disclosure, a method for removing particles is provided. The method includes following operations. A pellicle is received. The pellicle includes a pellicle membrane and a pellicle frame. At least a particle is disposed on the pellicle membrane. Light beams are generated to form an optical trap. The optical trap extends in a direction perpendicular to the pellicle membrane. The particle is removed from the pellicle membrane by the optical trap.

According to one embodiment of the present disclosure, a method for removing particles is provided. The method includes following operations. A pellicle is received. The pellicle includes a pellicle membrane and a pellicle frame. At least a particle is disposed in the pellicle frame. Light beams are generated to form an optical trap. The particle is removed from the pellicle frame by the optical trap.

According to one embodiment of the present disclosure, a method for removing particles is provided. The method includes following operations. A photomask is received. The photomask includes a photomask substrate and an absorber pattern formed on the photomask substrate. At least a particle is disposed on the absorber pattern. The photomask is flipped. Light beams are generated to form an optical trap. The particle is removed from the absorber pattern by the optical trap and a gravitational force.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing particles, comprising:
   receiving a pellicle comprising a pellicle membrane and a pellicle frame, wherein at least a particle is disposed on the pellicle membrane;
   generating light beams to pass through an object lens to form an optical trap, wherein the optical trap extends in a direction perpendicular to the pellicle membrane,
   the light beams are focused on a focal region by the object lens, and
   the particle is attracted to be trapped at the focal region; and
   removing the particle from the pellicle membrane by the optical trap.

2. The method of claim 1, further comprising forming a linear-modularized multi- optical trap extending in the direction perpendicular to the pellicle membrane.

3. The method of claim 1, wherein the generating of the light beams and the removing of the particle are performed prior to attaching the pellicle to a photomask substrate.

4. The method of claim 1, wherein the generating of the light beams and the removing of the particle are performed after attaching the pellicle to a photomask substrate.

5. The method of claim 1, further comprising performing an exposure operation prior to the generating of the light beams and the removing of the particle.

6. The method of claim 1, wherein the light beams comprise laser light beams.

7. The method of claim 1, wherein the light beams comprise infrared (IR) light beams.

8. A method for removing particles, comprising:
   receiving a pellicle comprising a pellicle membrane and a pellicle frame, wherein at least a particle is disposed in the pellicle frame;
   generating light beams to pass through an object lens to form an optical trap wherein the optical trap extends in a direction perpendicular to the pellicle frame,
   the light beams are focused on a focal region by the object lens, and
   the particle is attracted to be trapped at the focal region; and
   removing the particle from the pellicle frame by the optical trap.

9. The method of claim 8, wherein the optical trap extends in the direction perpendicular to a direction of gravitational force.

10. The method of claim 9, further comprising forming a linear-modularized multi-optical trap extending in a direction perpendicular to the pellicle membrane.

11. The method of claim 8, wherein the optical trap extends in a direction, and the direction and the pellicle membrane form an included angle of less than 90°.

12. The method of claim 11, wherein the optical trap removes the particles from a junction between the pellicle frame and the pellicle membrane.

13. The method of claim 8, wherein the generating of the light beams and the removing of the particle are performed prior to attaching the pellicle to a photomask substrate.

14. The method of claim 8, wherein the generating of the light beams and the removing of the particle are performed after attaching the pellicle to a photomask substrate.

15. The method of claim 8, wherein the light beams comprise laser light beams or infrared (IR) light beams.

16. A method for removing particles, comprising:
   receiving a photomask comprising a photomask substrate and an absorber pattern formed on the photomask substrate, wherein at least a particle is disposed on the absorber pattern;
   flipping the photomask;
   generating light beams to pass through an object lens to form an optical trap,
   wherein the optical trap extends in a direction perpendicular to the photomask substrate,
   the light beams are focused on a focal region by the object lens, and the particle is attracted to be trapped at the focal region; and removing the particle from the absorber pattern by the optical trap and a gravitational force.

17. The method of claim 16, further comprising melting the particle by the light beams.

18. The method of claim 17, further comprising using a continuous wave (CW) laser to melt the particle.

19. The method of claim 16, wherein the photomask is received from an EUV scanner chamber.

20. The method of claim 16, wherein the particle comprises a tin ball.

* * * * *